(12) United States Patent
Buckner et al.

(10) Patent No.: US 9,978,486 B2
(45) Date of Patent: May 22, 2018

(54) LOAD RESISTOR SUPPORTS

(71) Applicant: Fluke Corporation, Everett, WA (US)

(72) Inventors: Mark Steven Buckner, Shoreline, WA (US); Steven Wayne Higgins, Kenmore, WA (US); Donald A. Gessling, Woodinville, WA (US); Bryan Charles Hoog, Lake Stevens, WA (US); Michael A. Schoch, Granite Falls, WA (US)

(73) Assignee: Fluke Corporation, Everett, WA (US)

( * ) Notice: Subject to any disclaimer, the term of this patent is extended or adjusted under 35 U.S.C. 154(b) by 0 days. days.

(21) Appl. No.: 15/410,409

(22) Filed: Jan. 19, 2017

(65) Prior Publication Data
US 2017/0207010 A1    Jul. 20, 2017

Related U.S. Application Data

(60) Provisional application No. 62/280,612, filed on Jan. 19, 2016.

(51) Int. Cl.
*H05B 3/00*     (2006.01)
*H05K 3/30*     (2006.01)
(Continued)

(52) U.S. Cl.
CPC ............. *H01C 13/02* (2013.01); *H05K 1/181* (2013.01); *H05K 2201/10022* (2013.01); *H05K 2201/10227* (2013.01)

(58) Field of Classification Search
CPC .......... H01C 1/01; H01C 1/014; H01C 13/02; H05K 2201/10022; H05K 3/303;
(Continued)

(56) References Cited

U.S. PATENT DOCUMENTS

| 526,605 A | * | 9/1894 | Baker | ...................... | H05B 3/48 338/250 |
| 1,993,495 A | * | 3/1935 | Weiscopf | ................. | H01C 1/01 338/260 |

(Continued)

OTHER PUBLICATIONS

Vishay Dale, "HL Brackets and Sliders—HL Brackets: HL, HLA, HLT, HLW, HLZ, NHL, NHLW," Revision Mar. 12, 2014, retrieved from URL=http://www.vishay.com/docs/30279/mounthw.pdf , 2 pages.

*Primary Examiner* — Chau N Nguyen
*Assistant Examiner* — Roshn Varghese
(74) *Attorney, Agent, or Firm* — Seed Intellectual Property Law Group LLP

(57) ABSTRACT

A resistor support assembly includes first, second, third, and fourth support members. Each of the first and second support members includes one or more resistor contact regions and apertures extending therethrough. Each third support member is at least partially disposed within one of the apertures of one of the first support members and one of the apertures of one of the second support members. Recesses may be formed in the resistor contact regions of the first and the second support members, and one or more load resistors may be at least partially disposed within the recesses. The resistor support assembly may be used to mount one or more load resistors to a printed circuit board, without obstructing airflow through hollow portions of the load resistors. To reduce parasitic capacitance and inductance, the first support members and the second support members are formed from non-conductive materials.

18 Claims, 5 Drawing Sheets

(51) Int. Cl.
  *H05K 7/12*   (2006.01)
  *H01B 17/00*  (2006.01)
  *H05K 1/14*   (2006.01)
  *H05K 1/00*   (2006.01)
  *H05K 1/18*   (2006.01)
  *H05K 7/00*   (2006.01)
  *H01C 3/10*   (2006.01)
  *H01C 7/22*   (2006.01)
  *H01C 13/02*  (2006.01)

(58) Field of Classification Search
  CPC .... H05K 3/325; H05K 5/0091; H05K 7/1407; H01L 23/32; H05B 3/40
  USPC .......... 174/138 G, 138 J, 191, 197; 338/230, 338/272, 294, 304, 315, 318, 319, 320; 361/738, 758, 766; 439/620.24
  See application file for complete search history.

(56) References Cited

U.S. PATENT DOCUMENTS

| | | | | |
|---|---|---|---|---|
| 2,931,997 | A * | 4/1960 | Scribner | H01C 1/146 248/201 |
| 2,971,175 | A * | 2/1961 | Abrahamson | H05B 3/16 338/217 |
| 3,967,094 | A * | 6/1976 | Petersen | H05B 3/32 174/138 J |
| 4,333,069 | A * | 6/1982 | Worth | H01C 1/01 338/270 |
| 4,420,795 | A * | 12/1983 | Scholz | H05K 3/301 338/197 |
| 4,757,610 | A * | 7/1988 | McElheny | H01C 13/02 361/513 |
| 4,999,602 | A * | 3/1991 | Hayashi | H01C 7/00 338/308 |
| 5,170,323 | A * | 12/1992 | Perretta | H05K 7/12 361/704 |
| 5,377,939 | A * | 1/1995 | Kirma | F16B 7/048 248/68.1 |
| 5,996,945 | A * | 12/1999 | Coles | F16L 3/2235 248/68.1 |

* cited by examiner

LOAD RESISTOR SUPPORTS

BACKGROUND

Technical Field

The present disclosure relates to electrical circuit assemblies and more particularly to resistor support structures that mount resistors to printed circuit assemblies.

Description of the Related Art

Conventional resistor support structures include conductive elements that can cause undesirable parasitic capacitance and inductance effects. For example, one past resistor support structure for mounting a cylindrical load resistor to a printed circuit board includes a metallic rod, which is inserted through a hollow portion of the cylindrical load resistor, and a pair of metallic brackets each having a first portion that connects to the printed circuit board and a second portion that supports one end of the metallic rod. In addition to contributing to undesirable parasitic capacitance and inductance effects, the metallic rod and support brackets obstruct airflow through the hollow portion of the cylindrical load resistor, which can cause the cylindrical load resistor to overheat. Other conventional resistor support structures use components formed from relatively heavy and expensive materials (e.g., Teflon), which also can obstruct airflow through a hollow portion of a cylindrical load resistor. Some conventional resistor support structures include metallic components that are soldered to printed circuit boards, which may cause them to be unreliable if the solder cracks.

BRIEF SUMMARY

In one embodiment of the present disclosure, a resistor support assembly is provided. The resistor support assembly includes a first support member, a second support member, and a plurality of third support members. The first support member includes a resistor contact region and a plurality of apertures extending therethrough. The second support member includes a resistor contact region and a plurality of apertures extending therethrough. Each of the third support members is at least partially disposed within one of the apertures of the first support member and one of the apertures of the second support member.

The resistor support assembly may include a resistor disposed between the resistor contact region of the first support member and the resistor contact region of the second support member. The resistor may be a load resistor having a hollow portion extending therethrough, and airflow through the hollow portion of the load resistor may be unobstructed by the first support member, the second support member, and the third support members. The resistor contact regions of the first support member and the second support member may include a recess, and the resistor may be partially disposed within the recess of the first support member and the recess of the second support member. The first support member may include a first surface and a second surface opposite the first surface, and a recess may be formed in the first surface and a plurality of recesses may be formed in the second surface.

The resistor support assembly may include a fourth support member and a plurality of bolts. The fourth support member may be adjacent to the second support member. Each of the third support members includes an aperture. Each of the bolts may be at least partially disposed within one of the apertures of the first support member, one of the apertures of the second support member, the aperture of one of the third support members, and one of the apertures of the fourth support member. The first support member and the second support member may be formed from silicone, the third support members may be formed from nylon, and the fourth support member may be formed from FR-4.

In another embodiment of the present disclosure, a resistor support assembly is provided. The resistor support assembly includes a plurality of first support members, a plurality of second support members, and a plurality of third support members. Each of the first and second support members includes one or more resistor contact regions and a plurality of apertures extending therethrough. Each of the third support members is at least partially disposed within one of the apertures of one of the first support members and one of the apertures of one of the second support members.

The resistor support assembly may include one or more resistors, and each of the one or more resistors may be disposed between one of the resistor contact regions of one of the first support members and one of the resistor contact regions of one of the second support members. Each of the resistors may be a load resistor having a hollow portion extending therethrough, and airflow through the hollow portion of each of the resistors may be unobstructed by the first support member, the second support member, and the third support members. Each of the resistor contact regions of the first and second support members may include a recess, and each of the resistors may be partially disposed within one of the recesses of one of the first support members and one of the recesses of one of the second support members. Each of the first support members may include a first surface and a second surface opposite the first surface, and one or more recesses may be formed in the first surface in the resistor contact region of each of the first support members and a plurality of recesses may be formed in the second surface of each of the first support members.

The resistor support assembly may include a plurality of fourth support members and a plurality of bolts. Each of the fourth support members may be adjacent to one of the second support members and may include a plurality of apertures. Each of the third support members may include an aperture. Each of the bolts may be at least partially disposed within one of the apertures of one of the first support members, one of the apertures of one of the second support members, the aperture of one of the third support members, and one of the apertures of one of the fourth support members. The first support member and the second support member may be formed from silicone, the third support members are formed from nylon, and the fourth support member is formed from FR-4.

In yet another embodiment of the present disclosure, a circuit assembly is provided. The circuit assembly includes a plurality of first support members, a plurality of second support members, a plurality of third support members, a plurality of fourth support members, a printed circuit board, and one or more resistors. Each of the first and second support members includes one or more recesses and a plurality of apertures extending therethrough. Each of the third support members is at least partially disposed within one of the apertures of one of the first support members and one of the apertures of one of the second support members. Each of the fourth support members is adjacent to one of the second support members and includes a plurality of apertures extending therethrough. The printed circuit board is coupled to the fourth support members. Each of the one or more resistors is at least partially disposed within one of the recesses of one of the first support members and one of the recesses of one of the second support members.

Each of the one or more resistors may be disposed between at least four of the third support members. Each of the one or more resistors may be a load resistor having a hollow portion that extends therethrough, and airflow through the hollow portion may be unobstructed by the first support members, the second support members, the third support members, and the fourth support members. The first support members and the second support members may be formed from silicone, the third support members may be formed from nylon, and the fourth support members may be formed from FR-4. Each of the first support members may include a first surface and a second surface opposite the first surface, and the recesses of the first support members may be formed in the first surface and the second surface. The circuit assembly may include a plurality of bolts. Each of the third support members may include an aperture. Each of the bolts may be at least partially disposed within one of the apertures of one of the first support members, one of the apertures of one of the second support members, the aperture of one of the third support members, and one of the apertures of one of the fourth support members.

DETAILED DESCRIPTION

Figure 1:
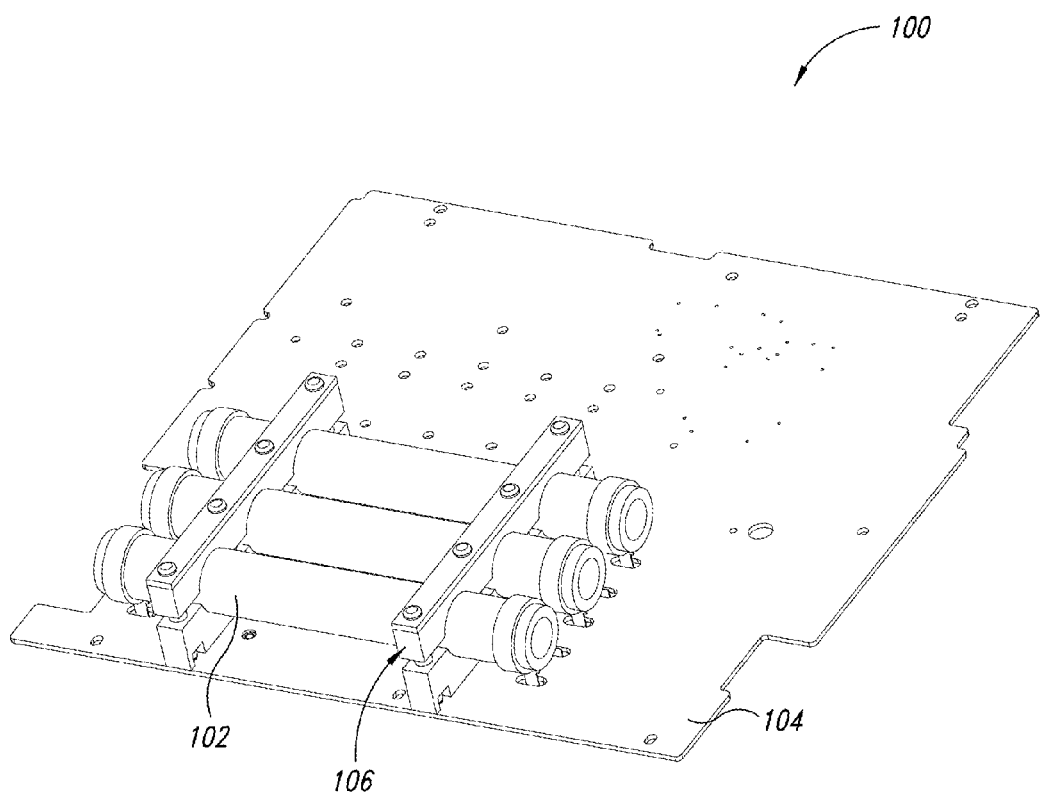
FIG. 1 is a perspective view of a circuit assembly according to an embodiment of the present disclosure.

FIG. 1 is a perspective view of a circuit assembly 100 according to an embodiment of the present disclosure. In one embodiment, the circuit assembly 100 is included in an analyzer device that is used to test electrosurgical units for generator output and leakage of high frequency (HF) electromagnetic waves, though in other embodiments, the circuit assembly 100 may be used for other purposes.

Figure 2:
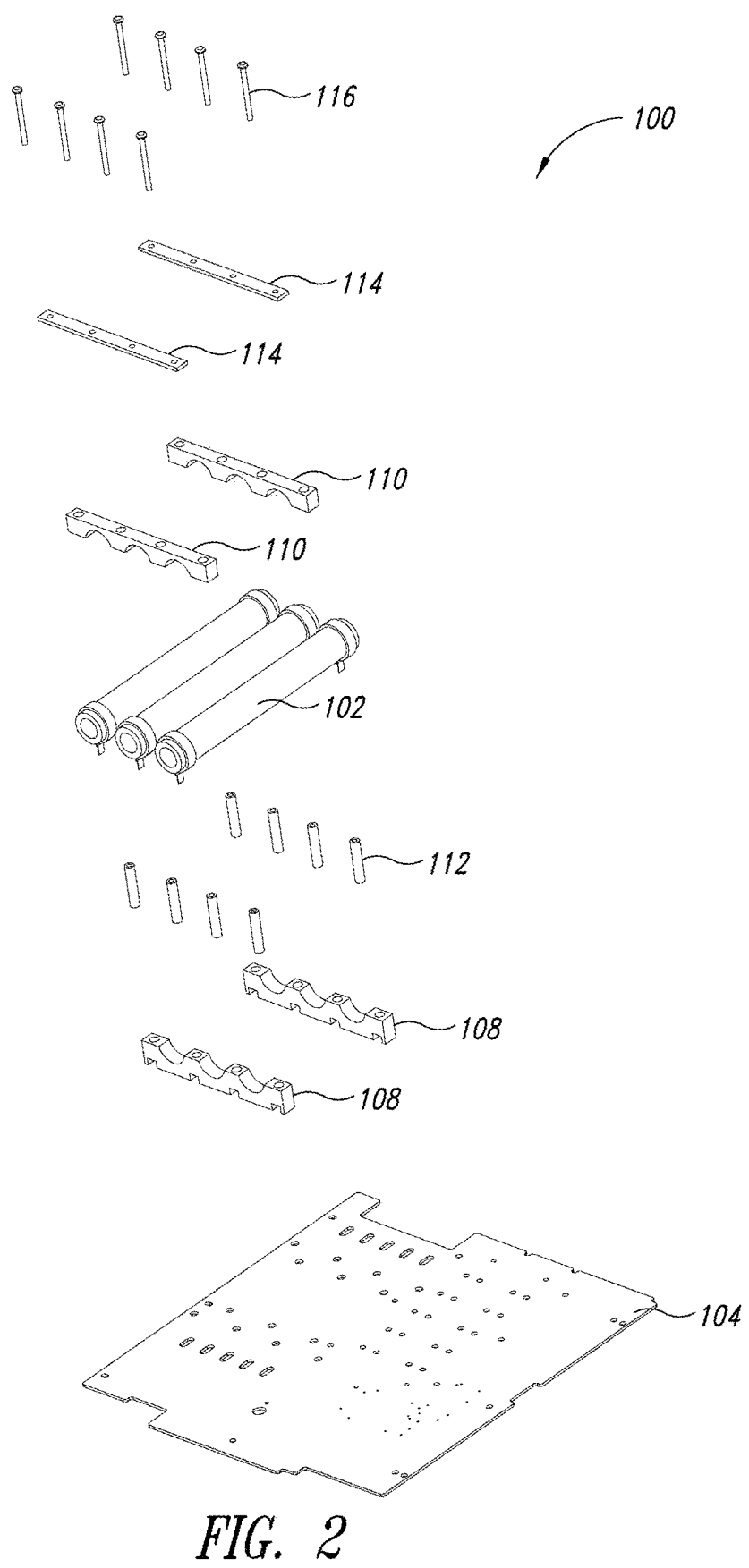
FIG. 2 is an exploded perspective view of the circuit assembly shown in FIG. 1.

FIG. 2 is an exploded perspective view of the circuit assembly 100. The circuit assembly 100 shown in FIGS. 1 and 2 includes a plurality of cylindrical load resistors 102 mounted to a printed circuit assembly 104 using a resistor support assembly 106. Although the resistor support assembly 106 is not labeled in FIG. 2, components of the resistor support assembly 106 are shown in FIG. 2. The resistor support assembly 106 includes a plurality of first support members 108, a plurality of second support members 110, a plurality of third support members 112, a plurality of fourth support members 114, and a plurality of bolts 116.

In one embodiment, by way of example, the first support members 108 and the second support members 110 are formed from a closed cell, silicone foam, which is a non-conductive material. The third support members 112 are formed from nylon, which is a non-conductive material. The fourth support members 114 are formed from FR-4, which is a non-conductive, flame retardant, glass-reinforced epoxy laminate. The bolts 116 are formed from steel.

Figure 3:
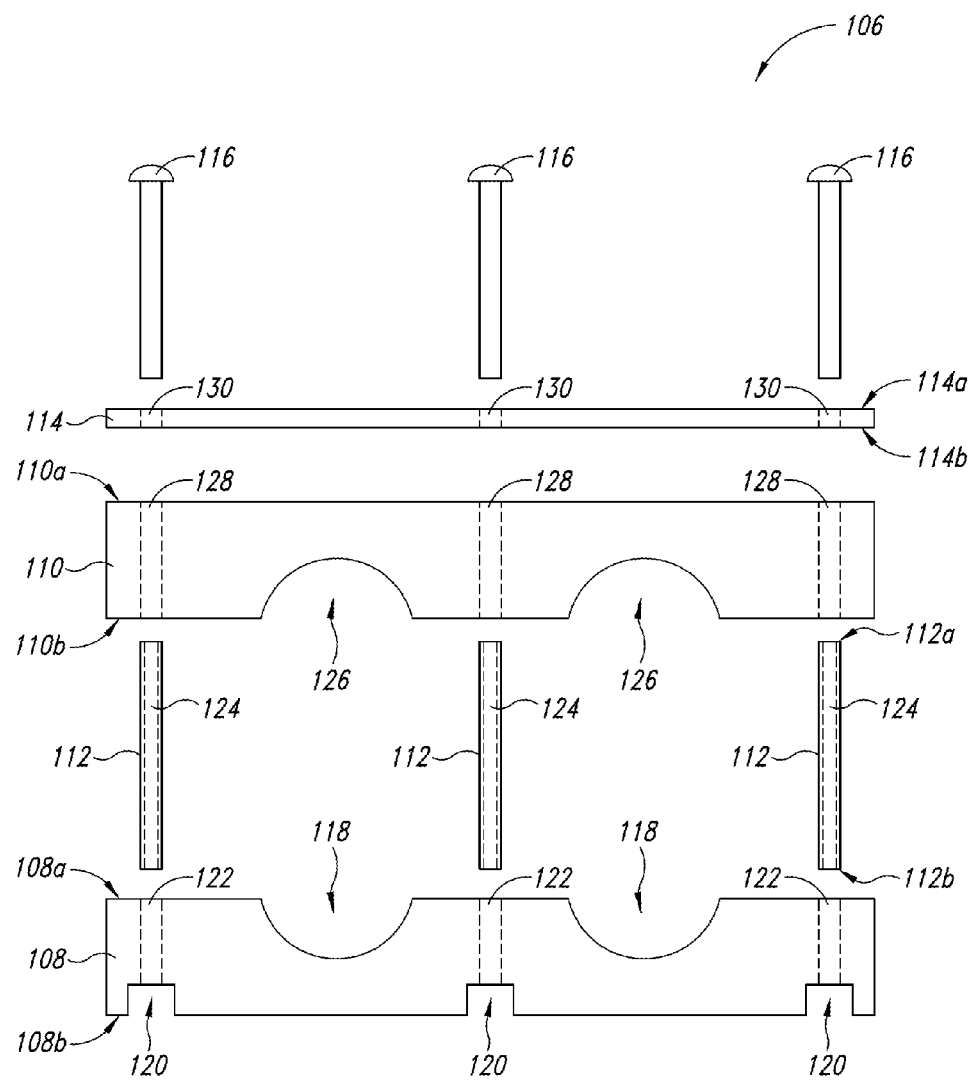
FIG. 3 is an exploded side view of portions of a resistor support assembly according to an embodiment of the present disclosure.

FIG. 3 is an exploded side view of portions of a resistor support assembly 106 according to an embodiment of the present disclosure. More particularly, one half of the resistor support assembly 106 is illustrated in FIG. 3. Thus, the complete resistor support assembly 106, in accordance with at least one embodiment, includes two first support members 108, two second support members 110, six third support members 112, two fourth support members 114, and six bolts 116. In other embodiments, other quantities of support members and bolts may be used. As will be explained below, one set of the components shown in FIG. 3 support one end of a pair of load resistors 102 and another set of the components shown in FIG. 3 support the other end of the pair of load resistors 102.

As shown in FIG. 3, the first support member 108 of the resistor support assembly 106 includes a first surface 108a and an opposing second surface 108b. A plurality of recesses 118 is formed in the first support member 108, wherein each recess 118 extends into the first support member 108 from the first surface 108a. In addition, a plurality of recesses 120 is formed in the first support member 108, wherein each recess 120 extends into the support member 108 from the second surface 108b. A plurality of apertures 122 is formed in the first support member 108, wherein each aperture 122 extends from the first surface 108a to the top of one of the recesses 120. The diameter of each of the apertures 122 of the first support member 108 is slightly larger than an outer diameter of each of the third support members 112. Thus, the third support members 112 can be inserted into the apertures 122 of the first support member 108.

The second support member 110 of the resistor support assembly 106 includes a first surface 110a and an opposing second surface 110b. A plurality of recesses 126 is formed in the second support member 110, wherein each recess 126 extends into the second support member 110 from the second surface 110b. In at least one embodiment, each recess 126 of the second support member 110 and each recess 118 of the first support member 108 has the same semi-circular shape and dimensions. A plurality of apertures 128 is formed in the second support member 110, wherein each aperture 128 extends from the first surface 110a to the second surface 110b. The diameter of each of the apertures 128 is slightly larger than an outer diameter of each of the third support members 112. Thus, the third support members 112 can be inserted into the apertures 128 of the second support member 110.

Each of the third support members 112 of the resistor support assembly 106 includes a first surface 112a and an opposing second surface 112b. An aperture 124 is formed in each of the third support members 112, wherein the aperture 124 extends from the first surface 112a to the second surface 112b. Each aperture 124 has a diameter that is slightly larger than the outer diameter of the shafts of the bolts 116. Thus, the shafts of the bolts 116 can be inserted into the apertures 124 of the third support members 112. In at least one embodiment, each of the third support members 112 has a cylindrical shape.

Each fourth support member 114 of the resistor support assembly 106 includes a first surface 114a and an opposing second surface 114b. A plurality of apertures 130 is formed in the fourth support member 114, wherein each aperture 130 extends from the first surface 114a to the second surface 114b. The diameter of each of the apertures 130 is slightly larger than an outer diameter of each of the shafts of each of the bolts 116. Thus, the shafts of the bolts 116 can be inserted into the apertures 130 of the fourth support member 114.

Assembly of an embodiment of a circuit assembly 100 according to the present disclosure will now be described with reference to FIGS. 3 and 4A-4D. FIGS. 4A-4D illustrate one portion of the circuit assembly 100, which includes, among other things, a set of the components illustrated in FIG. 3. Another portion of the circuit assembly 100, which is not illustrated, includes, among other things, another set of the components illustrated in FIG. 3. Unless otherwise stated, the same acts described below for assembling the portion of the circuit assembly 100 illustrated in FIGS. 4A-4D are repeated for the other portion of the circuit assembly 100, which is not illustrated.

Figure 4A:
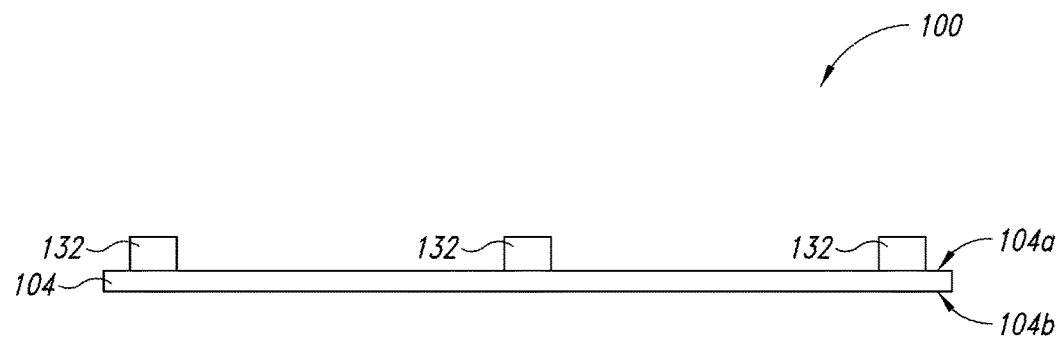
FIGS. 4A-4D are side views of portions of a circuit assembly according to an embodiment of the present disclosure.

As shown in FIG. 4A, the printed circuit assembly 104 includes a first surface 104a and an opposing second surface 104b. A plurality of surface mount threaded standoffs 132 is disposed on the first surface 104a of the printed circuit assembly 104. In at least one embodiment, each of the surface mount threaded standoffs 132 is soldered to the first surface 104a of the printed circuit assembly 104. Each of the surface mount threaded standoffs 132 has threads (not shown) formed on an aperture (not shown) therein. Each of the bolts 116 includes a head and a shaft, which extends from the head and includes threads (not shown). The threads (not shown) included on the shaft of the bolts 116 are complimentary to the threads (not shown) formed in the surface mount threaded standoffs 132.

Figure 4B:
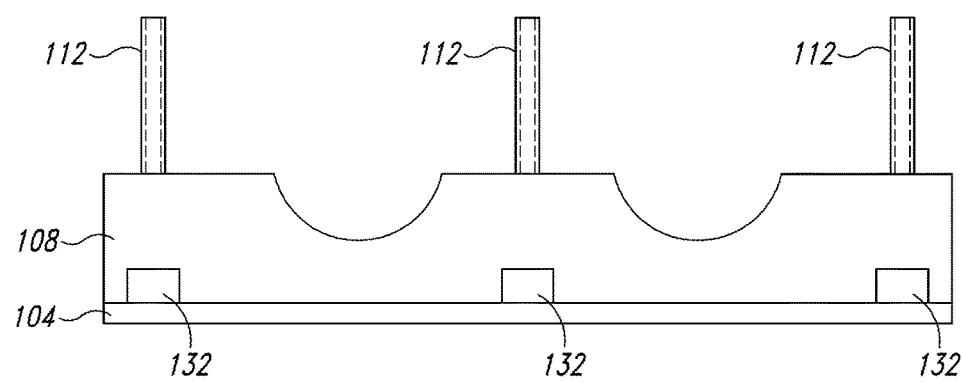

As shown in FIG. 4B, one of the first support members 108 is placed on the first surface 104a of the printed circuit assembly 104 such that the surface mount threaded standoffs 132 are disposed within the recesses 120 formed in the first support member 108. Three of the third support members 112 are then inserted into the apertures 122 formed in the first support member 108. This procedure is then repeated for the other portion of the circuit assembly 100, which is not illustrated.

Figure 4C:
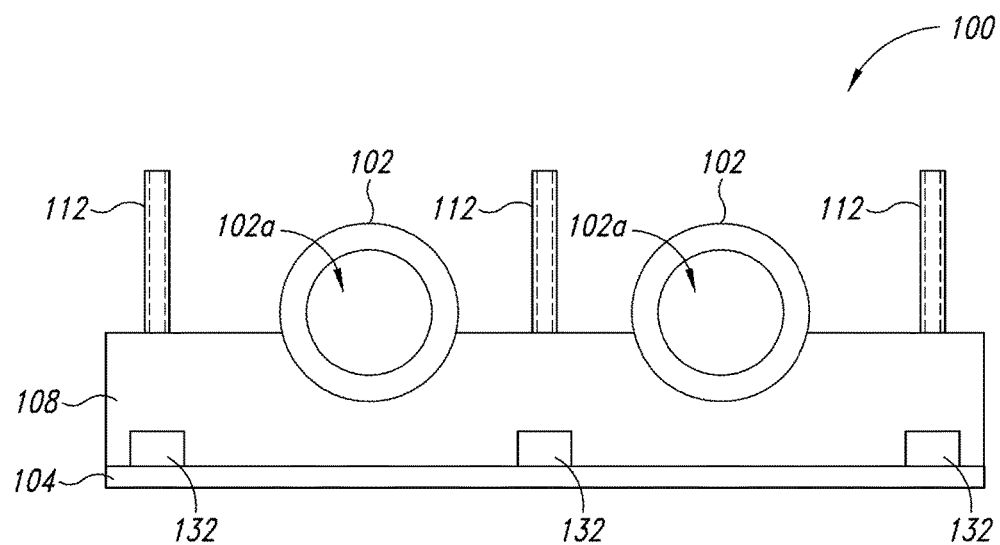

As shown in FIG. 4C, the cylindrical load resistors 102 are placed onto the first support members 108 (only one of which is illustrated in FIG. 4C). More particularly, the cylindrical load resistors 102 are placed onto the first support members 108 such that they are partially disposed within the recesses 118 of the first support members 108. In at least one embodiment, the cylindrical load resistors 102 are formed from a ceramic material. Although not illustrated in FIG. 4C, each of the cylindrical load resistors 102 in this example includes two metallic bands, wherein each metallic band has a first portion that is disposed around one of the ends of the cylindrical load resistor 102 and a second portion that extends from the first portion and connects to the printed circuit assembly 104. Each of the cylindrical load resistors 102 in this example also includes a hollow portion 102a. None of the components of the resistor support assembly 106 obstruct the hollow portions 102a of the cylindrical load resistors 102 so that air can pass freely through the hollow portions 102a to cool the cylindrical load resistors 102.

Figure 4D:
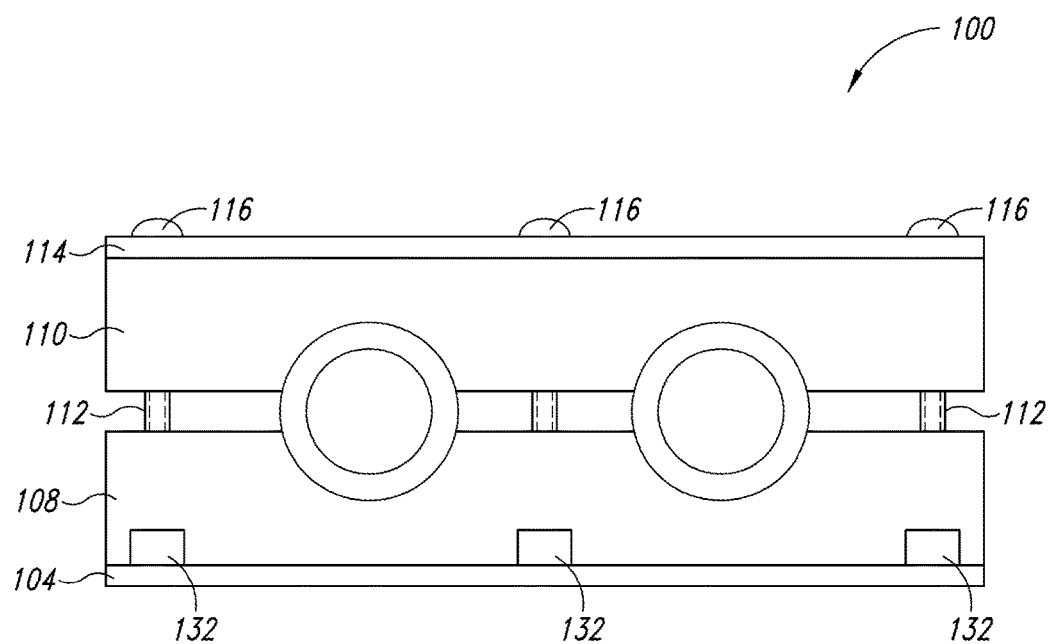

As shown in FIG. 4D, one of the second support members 110 is placed over the cylindrical load resistors 102. More particularly, the second support member 110 is placed such that the cylindrical load resistors 102 are partially disposed within the recesses 126 of the second support member 110, and the upper portions of the third support members 112 are inserted into the apertures 128 formed in the second support member 110. One of the fourth support members 114 is then placed onto the second support member 110 such that the apertures 130 of the fourth support members 114 are aligned with the apertures 128 of the second support member 110. Three of the bolts 116 are then used to secure the first support member 108, the second support member 110, the third support members 112, and the fourth support member 114 to the printed circuit assembly 104.

More particularly, the shafts of three of the bolts 116 are inserted through the apertures 130 of the fourth support members 114, the apertures 128 of the second support members 110, the apertures 124 of the third support members 112, and the apertures 122 of the first support member 108. A screwdriver, for example, is then used to rotate the heads of the bolts 116 so that the threads (not shown) provided on the shafts of the bolts 116 engage the threads (not shown) formed in the surface mount threaded standoffs 132, until the bolts 116 are securely fastened to the surface mount threaded standoffs 132. This procedure is then repeated for the other portion of the circuit assembly 100, which is not illustrated.

As shown in FIG. 4D, the height of each of the third support members 112 is greater than the combined height of the first support member 108 and the second support member 110. Accordingly, the third support members 112 cause the first support members 108 to be spaced apart from the second support members 110. The space between the first support members 108 and the second support members 110 enables greater airflow around the exterior of the cylindrical load resistors 102 than would be possible if the first support members 108 and the second support members 110 abutted. Such airflow helps to cool the cylindrical load resistors 102 during operation of the circuit assembly 100.

As previously noted, in at least one embodiment, the second support members 110 are formed from a closed cell, silicone foam and the fourth support members 114 are formed from FR-4. FR-4 is structurally more rigid than closed cell, silicone foam. This provides several advantages. First, the fourth support members 114 are sufficiently rigid that the apertures 130 would not expand under high operating temperatures and enable the fourth support members 114 to move over the heads of the bolts 116, which could cause the fourth support members 114 (and possibly other components) to fall off of the printed circuit assembly 104. In addition, the relatively rigid fourth support members 114 distribute compression forces over the length of the second support members 110. For example, the fourth support members 114 cause compression forces from the heads of the bolts 116 to be spread over the length of the second support members 110, which could prevent the second support members 110 from being deformed or damaged.

After the resistor support assembly 106 is assembled as described above, the cylindrical load resistors 102 are secured to the printed circuit assembly 104. The resistor support assembly 106 supports the cylindrical load resistors 102 such that they are elevated off of the printed circuit assembly 104, which enables air to flow between the cylindrical load resistors 102 and the printed circuit assembly 104. Also, because none of the components of the resistor support assembly 106 are provided at the ends of the cylindrical load resistors 102, the resistor support assembly 106 enables unobstructed airflow through the cylindrical hollow portions 102a of the cylindrical load resistors 102, which cools the cylindrical load resistors 102 during operation of the circuit assembly 100. This feature is particularly important when the cylindrical load resistors 102 are formed from ceramic materials that can heat up to over 300° C. when an electrical load is passed through the cylindrical load resistors 102. In at least one embodiment, the resistor support assembly 106 may be used with resistors 102 that are specified for a maximum operating temperature of 350° C.

The resistor support assembly 106 also provides strain relief to the cylindrical load resistors 102. For example, the resistor support assembly 106 relieves mechanical stresses and strains caused by misalignment of the cylindrical load resistors 102, vibrations, etc. Also, because the resistor support assembly 106 is not soldered to the printed circuit assembly 104, the resistor support assembly 106 is more reliable than prior resistor support structures that are soldered to printed circuit assemblies. In addition, because most of the components of the resistor support assembly 106 are made from non-conductive materials, the resistor support assembly 106 does not cause undesirable parasitic capacitance and inductance in the circuit assembly 100. Moreover, the resistor support assembly 106 is relatively easy to assemble compared to conventional resistor support structures.

In addition, because the resistor support assembly 106 employs compression mounting and wire jumpers are used to electrically couple ends of the resistors 102 to the printed circuit assembly 104, the resistor support assembly 106 may be attached to the resistors 102 at different locations on the bodies of the resistors 102. Accordingly, the resistor support assembly 106 does not require each of the resistors 102 to have the same dimensions. For example, the resistor support assembly 106 may be used with resistors 102 that were built in different batches and have different dimensions.

Other embodiments of the present disclosure may include greater or fewer components than those of the illustrated embodiments. In other embodiments of the present disclosure, the sizes, materials, and dimensions of various components may be different than those of the illustrated embodiments. In other embodiments of the present disclosure, resistors of different shapes and compositions may be held by the support assembly. In other embodiments of the present disclosure, circuit components other than resistors 102 may be held by the support assembly. Also, while bolts are shown, other fasteners, e.g., clips or adhesives, may be used when assembling the support assembly.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A resistor support assembly, comprising:
    a first support member including a resistor contact region and a plurality of apertures extending therethrough;
    a second support member including a resistor contact region and a plurality of apertures extending therethrough;
    a plurality of third support members, wherein each of the third support members is at least partially disposed within one of the apertures of the first support member and one of the apertures of the second support member;
    a fourth support member including a plurality of apertures, wherein the fourth support member is adjacent to the second support member; and
    a plurality of bolts,
    wherein each of the third support members includes an aperture,
    wherein each of the bolts is at least partially disposed within one of the apertures of the first support member, one of the apertures of the second support member, the aperture of one of the third support members, and one of the apertures of the fourth support member; and
    wherein the first support member and the second support member are formed from silicone, the third support members are formed from nylon, and the fourth support member is formed from FR-4.

2. The resistor support assembly according to claim 1, further comprising:
    a resistor disposed between the resistor contact region of the first support member and the resistor contact region of the second support member.

3. The resistor support assembly according to claim 2 wherein the resistor is a load resistor having a hollow portion extending therethrough, and wherein airflow through the hollow portion of the load resistor is unobstructed by the first support member, the second support member, and the third support members.

4. The resistor support assembly according to claim 2 wherein the resistor contact region of the first support member includes a recess and the resistor contact region of the second support member includes a recess, and the resistor is partially disposed within the recess of the first support member and the recess of the second support member.

5. The resistor support assembly according to claim 1, further comprising:
    a plurality of threaded standoffs,
    wherein the first support member includes a first surface and a second surface opposite the first surface, and a recess is formed in the first surface and a plurality of recesses is formed in the second surface, and
    wherein the resistor contact region is disposed within the recess formed in the first surface of the first support member, and one of the threaded standoffs is disposed within each of the recesses formed in the second surface of the first support member.

6. The resistor support assembly according to claim 1 wherein the second support member is spaced apart from the first support member providing an air gap between the first and second support members that allows air to flow between the first and second support members, and wherein each of the third support members extends across the air gap between the first and second support members.

7. A resistor support assembly, comprising:
    a plurality of first support members, wherein each of the first support members includes one or more resistor contact regions and a plurality of apertures extending therethrough;
    a plurality of second support members, wherein each of the second support members includes one or more resistor contact regions and a plurality of apertures extending therethrough;
    a plurality of third support members, wherein each of the third support members is at least partially disposed within one of the apertures of one of the first support members and one of the apertures of one of the second support members;
    a plurality of fourth support members, wherein each of the fourth support members is adjacent to one of the second support members and includes a plurality of apertures; and
    a plurality of bolts,
    wherein each of the third support members includes an aperture,
    wherein each of the bolts is at least partially disposed within one of the apertures of one of the first support members, one of the apertures of one of the second support members, the aperture of one of the third support members, and one of the apertures of one of the fourth support members, and wherein the first support member and the second support member are formed from silicone, the third support members are formed from nylon, and the fourth support member is formed from FR-4.

8. The resistor support assembly according to claim 7, further comprising:

one or more resistors, wherein each of the one or more resistors is disposed between one of the resistor contact regions of one of the first support members and one of the resistor contact regions of one of the second support members.

9. The resistor support assembly according to claim 8 wherein each of the resistors is a load resistor having a hollow portion extending therethrough, and wherein airflow through the hollow portion of each of the resistors is unobstructed by the first support member, the second support member, and the third support members.

10. The resistor support assembly according to claim 8 wherein each of the resistor contact regions of the first support members includes a recess, each of the resistor contact regions of the second support members includes a recess, and each of the resistors is partially disposed within one of the recesses of one of the first support members and one of the recesses of one of the second support members.

11. The resistor support assembly according to claim 7, further comprising:

a plurality of threaded standoffs, wherein each of the first support members includes a first surface and a second surface opposite the first surface, and one or more recesses are formed in the first surface in the resistor contact region of each of the first support members and a plurality of recesses is formed in the second surface of each of the first support members, and wherein each of the one or more resistor contact regions is disposed within one of the one or more recesses formed in the first surface of each of the first support members, and one of the threaded standoffs is disposed within each of the recesses formed in the second surface of each of the first support members.

12. A circuit assembly, comprising:

a plurality of first support members, wherein each of the first support members includes one or more recesses and a plurality of apertures extending therethrough;

a plurality of second support members, wherein each of the second support members includes one or more recesses and a plurality of apertures extending therethrough, and is spaced apart from a respective one of the first support members providing an air gap between the second support member and the respective one of the first support members that allows air to flow between the second support member and the respective one of the first support members;

a plurality of third support members, wherein each of the third support members is at least partially disposed within one of the apertures of one of the first support members and one of the apertures of one of the second support members, and extends across the air gap between one of the second support members and the respective one of the first support members;

a plurality of fourth support members, wherein each of the fourth support members is adjacent to one of the second support members and includes a plurality of apertures extending therethrough;

a printed circuit board coupled to the fourth support members; and one or more resistors, each of the one or more resistors being at least partially disposed within one of the recesses of one of the first support members and one of the recesses of one of the second support members.

13. The resistor support assembly according to claim 12 wherein each of the second support members is spaced apart from the first support member providing an air gap between the first and second support members that allows air to flow between the first and second support members, and wherein each of the third support members extends across the air gap between the first and second support members.

14. The circuit assembly according to claim 12 wherein each of the one or more resistors is a load resistor having a hollow portion that extends therethrough, and wherein airflow through the hollow portion is unobstructed by the first support members, the second support members, the third support members, and the fourth support members.

15. The circuit assembly according to claim 12 wherein the first support members and the second support members are formed from silicone, the third support members are formed from nylon, and the fourth support members are formed from FR-4.

16. The circuit assembly according to claim 12, further comprising:

a plurality of threaded standoffs, wherein each of the first support members includes a first surface and a second surface opposite the first surface, and the one or more recesses of the first support members are formed in the first surface, a plurality of recesses is formed in the second surface, and one of the threaded standoffs is disposed within each of the recesses formed in the second surface of each of the first support members.

17. The circuit assembly according to claim 12, further comprising:

a plurality of bolts, wherein each of the third support members includes an aperture, and wherein each of the bolts is at least partially disposed within one of the apertures of one of the first support members, one of the apertures of one of the second support members, the aperture of one of the third support members, and one of the apertures of one of the fourth support members.

18. The circuit assembly according to claim 12 wherein each of the one or more resistors is disposed between at least four of the third support members.

* * * * *